United States Patent [19]

Stefani

[11] 3,801,874

[45] Apr. 2, 1974

[54] ISOLATION MOUNTING FOR SEMICONDUCTOR DEVICE

[75] Inventor: Joseph P. Stefani, Warwick, R.I.

[73] Assignee: General Electric Company, Providence, R.I.

[22] Filed: Oct. 30, 1972

[21] Appl. No.: 301,849

[52] U.S. Cl. .......... 317/100, 317/234 A, 174/DIG. 5

[51] Int. Cl. .......... H01l 1/12

[58] Field of Search .......... 174/DIG. 5, 15 R, 16 R; 317/100, 234 A, 234 G

[56] References Cited

UNITED STATES PATENTS

| | | | |
|---|---|---|---|
| 3,641,474 | 2/1972 | Owens | 317/100 |
| 3,229,757 | 1/1966 | Root | 174/DIG. 5 |
| 3,571,663 | 3/1971 | Hungate | 317/100 |
| 3,411,049 | 11/1968 | Tuncossi | 317/100 |
| 3,465,212 | 9/1969 | Grimes | 317/100 |
| 3,430,336 | 3/1969 | Riddel | 317/234 A |

*Primary Examiner*—Herman J. Hohauser
*Assistant Examiner*—Gerald P. Tolin
*Attorney, Agent, or Firm*—Paul E. Rockford

[57] ABSTRACT

An isolation mounting for a semiconductor device includes a metal heat sink plate to receive heat from the semiconductor device and insulating means to electrically isolate the semiconductor device from the plate which receives the heat. A metal fastener presses the semiconductor device against an insulating wafer which is in turn pressed against the heat sink plate. An insulating liner separates the fastener electrically from metal of the semiconductor device.

8 Claims, 7 Drawing Figures

ISOLATION MOUNTING FOR SEMICONDUCTOR DEVICE

BACKGROUND OF THE INVENTION

The present invention relates to the electrically isolated mounting of electrically live semiconductor devices to larger metal heat sink structures. More particularly it relates to developing an effective thermal linkage between a semiconductor device and a larger heat sink while maintaining electrical isolation between the charged metal of the semiconductor device and the metal of a heat sink to which the device is mounted.

Semiconductor devices are known in the art which include a solid state switching element or chip mounted usually at one of its power electrodes directly to a conducting tab of metal. The conducting tab in such cases may serve the dual function of being both a first heat sink for the solid state switching element and of also being a conductor to conduct electricity to and from the first power electrode of the solid state element or chip. Two other electrically isolated conductors are electrically joined to the solid state chip, a first to a second power electrode and the second to a trigger electrode of the chip. Sometimes for convenience of wiring a third conductor may be electrically joined to the tab so as to be in electrical communication with the first power electrode.

There are some applications for semiconductor devices in which it is desirable that they be mounted to a second and larger heat sink as for example to the plate of a dimmer or similar device. However for such applications it is also desirable that the plate remain electrically neutral or at ground potential and not be electrically linked to the metal tab to which the solid state chip is electrically joined. To preserve the heat sink plate at a neutral or ground potential, special means are needed to insulate or isolate the plate electrically from the tab of a semiconductor device. However the use of prior insulating mountings has resulted in an increase in cost or in an increase in the thermal impedance of the heat path extending from the solid state chip, where the heat is primarily generated through the heat sink tab and electrical insulator to the heat sink plate to which the device is mounted.

Prior art attempts to achieve electrical isolation between such semiconductor devices and larger metal heat sinks within the economic constraints and other constraints imposed by the need for special suitability of the product for high volume, low cost, high yield production have not been altogether satisfactory. For example, some prior art attempts to solve this isolation problem, though achieving satisfactory electrical isolation, have involved subjecting the semiconductor device to excessive mechanical stresses or have resulted as indicated above in excessive heat rises within the semiconductor devices.

SUMMARY OF THE INVENTION

Accordingly one object of the present invention is to provide a low cost method of mounting semiconductor devices in good thermal contact with larger heat sinks but with effective electrical isolation between the semiconductor device and larger heat sink.

Another object is to provide at low cost a highly effective thermal path between a mounted semiconductor device and a heat sink.

A further object is to reduce the failure of isolation mounted semiconductor devices due to excessive heat rise in use.

The present invention in one embodiment thereof provides an isolation mounting for a semiconductor device including a heat sink plate having a mounting hole through it and a semiconductor device including a metal tab having a similar hole through it. The metal tab has a solid state chip mounted to it and has associated electrical leads extending from the solid state switch.

The mounting also includes a heat conductive electrically insulating wafer having a mounting hole through it and the holes of the plate, tab, and wafer are aligned. Metal attachment means such as a metal fastener extends through the respective holes and maintains the wafer between and in pressure contact with both the tab and the plate. The mounting further includes insulating means disposed between the tabs and the fastener.

Other objects will be in part apparent and in part pointed out in the description which follows.

The description will be better understood by reference to the accompanying drawing.

DESCRIPTION OF THE PREFERRED EMBODIMENT

Figure 1:
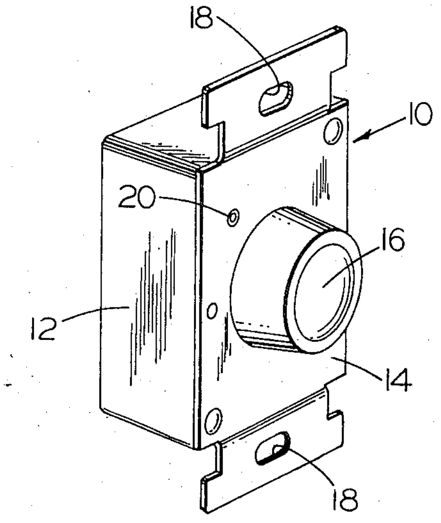
FIG. 1 is an external perspective view of a dimmer switch in which the isolation mounting of the present invention may be employed.
Figure 2:
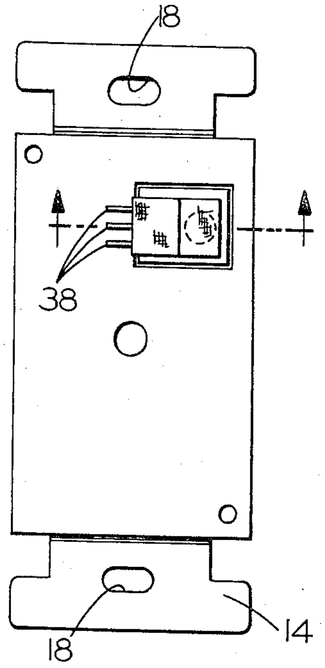
FIG. 2 is a rear elevation of a heat sink plate of a dimmer as seen in FIG. 1 illustrating a semiconductor device mounted to the back of the plate.
Figure 3:
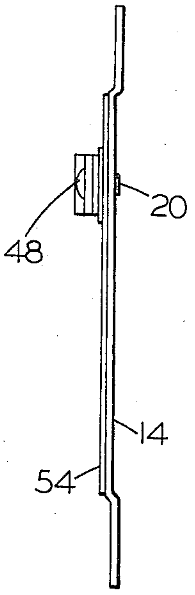
FIG. 3 is a side elevation of the plate as illustrated in FIG. 2.

Referring to the drawing a conventional wall dimmer 10 includes an insulating housing 12, a face plate 14, which serves as a heat sink plate and also as a mounting plate or bracket of the dimmer, and a knob 16.

The plate 14 has conventional screw holes 18 for mounting screws, not shown, such as are conventionally employed for mounting the dimmer within a wall box, also not shown. Plate 14 has extending through it a shank 24 and a formed end 20 of a metal fastener in the form of an attachment rivet 22.

The rivet 22 is itself formed of metal and it holds an electrically charged semiconductor device 30 to face plate 14, but the face plate 14 remains electrically isolated from the semiconductor device 30 as explained below. Although electrical isolation is maintained, very effective heat transfer between plate 14 and semiconductor device 30 are achieved by the mounting taught by this invention.

The semiconductor device itself is of conventional construction and may have a metal heat sink tab 32 with a mounting hole 34 in it. An insulating jacket 36 afixed to tab 32 encloses the solid state switching chip, not shown, and three electrical leads 38 extend to the exterior of jacket 36 from the solid state chip for connection into the appropriate conventional power control circuitry of a dimmer.

Electrical isolation between plate 14 and semiconductor device 30 is achieved by insulating wafer 40. This wafer must be electrically non-conducting but must be thermally conducting. In other words while the wafer serves to provide electrical isolation between device 30 and plate 14 it must also provide an effective heat conducting path so that heat received in tab 32 is quickly and effectively dissipated through wafer 40 and into plate 14. For this purpose more is needed than simple thermal contact between these three elements. What has been found to be necessary to achieve effective thermal communication between device 30 and plate 14 is a pressure contact through wafer 40. Such pressure contact provides an effective thermal interface both between tab 32 of device 30 and the heat conducting wafer 40, and between wafer 40 and heat sink plate 14. Wafer 40 may be formed of a heat conductive electrically insulating material as, for example, a metal oxide such as berryllium oxide or aluminum oxide of a similar substance in ceramic or other insulating form.

Figure 5:
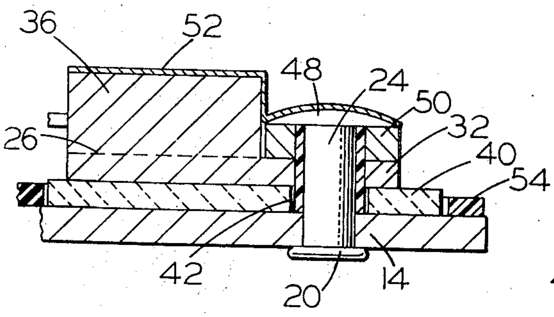
FIG. 5 is a vertical sectional view taken along the line 5—5 of FIG. 2 showing a mounted semiconductor device.
Figure 4:
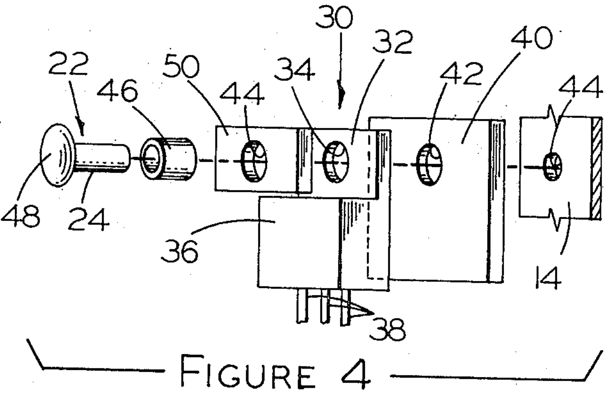
FIG. 4 is an exploded perspective view of the array of pre-assembly components used in mounting a semiconductor device to a heat sink plate.

To achieve this pressure contact at the two interfaces an attachment rivet 22 is employed to extend through four aligned holes 44, 34, 42 and 45 in the spacer 50, device 30, wafer 40, and plate 14 respectively. This rivet 22 is compressed and deformed in establishing the pressure contact at the two interfaces. End 20 is deformed from the form illustrated in FIG. 4 to that illustrated in FIG. 5 and this deformation results in compression of the assembled device 30, wafer 40 and plate 14 together with an insulating collar 46 and spacer 50.

To provide electrical isolation between rivet 22 and metal tab 32 of device 30 an insulating collar 46 and an insulating spacer 50 are mounted about the shank 24 of rivet 22 beneath rivet head 48.

The collar 46 is preferably of a more deformable material such as a thermoplastic and may be of a polytetrafluorethylene, or other fluoropolymers, irradiation cross linked polyethelene, or other deformable materials of similar insulating properties. By deformable in this instance is meant not only the capacity to be modified in its shape by mechanical stress or work but the capacity to be modified in its shape without rupture of the wall of the collar such as would interrupt its continuous insulating properties around the surface of shank 24 of rivet 22.

Spacer 50 is by contrast preferably a less deformable material and may be a material such as a laminated board formed under pressure. Several patents which describe laminated sheets of this sort or portions of such sheets are Nos. 2,291,616; 2,683,105; 2,810,674; 3,044,895; and 3,560,328. Such laminated sheet materials generally have very stable dimensional properties once subjected to an initial compression as in forming the isolation mounting of this invention. They are in other words much less subject to cold working and or cold flow under pressure than the thermoplastic deformable materials such as those of which collar 46 is preferably formed. Accordingly once a pressure contact is formed between elements such as tab 32 and wafer 40 this pressure contact will endure during the useful life of the mounting and the pressure will not be reduced or lost due to a cold working, or flow or creep of the material of spacer 50.

The length of collar 46 is slightly in excess of that needed to reach from the under surface of head 48 of rivet 22 through to wafer 40. Where collar 46 has such slight excess length it is compressed and deformed as rivet 22 is pressed and formed in place and the extra material of the collar may bulge outwards to form a snug fit within the aligned holes of the spacer 50, tab 30 and wafer 40.

This use of a more compressible or deformable collar 46 in cooperation with a less compressible or deformable spacer 50 and a deformable rivet 22 makes it possible to provide rapid low cost effective pressure contact of the rather fragile ceramic wafer 40 between metal tab 32 and metal plate 14 with reliability and accuracy even though some dimensional variation of the component parts, incident to low cost of the parts, may exist.

A desirably high contact pressure is developed over the surface of the wafer partly because both the tab and plate are formed of metal and they serve as plates which provide a lateral spread of the pressure.

Fracture of the delicate chip of the solid state element within the insulating jacket 36 is substantially avoided by use of the isolation mounting taught herein.

Although electrically insulated from tab 32 the shank 24 of rivet 22 does receive heat from the tab and convey it to plate 14.

Thermal contact between tab 32 and plate 14 through wafer 40 may be augmented by inclusion of a thermal grease or of a similar heat transfer aid at interfaces of the wafer at both metal surfaces which it confronts. Use of such aids is not essential to successful practice of the present invention.

An insulating layer 52 which may be in the form of a tape may be included over the rivet head and semiconductor device to avoid inadvertent contact with live electrical parts, not shown, in the dimmer housing 12. Also an insulating liner 54 may be included on the back of plate 14 for a similar purpose.

Additional alternative modes of practice of the present invention will be apparent to those skilled in the art.

Figure 7:
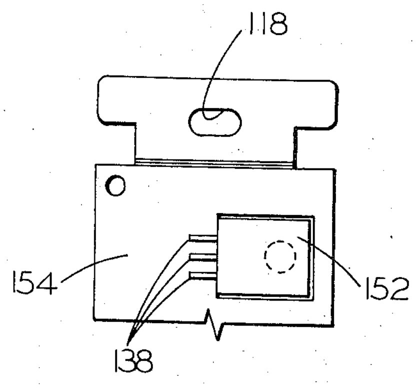
FIG. 7 is a rear elevation of a portion of a heat sink plate with the semiconductor device of FIG. 6 mounted to the back of the plate.
Figure 6:
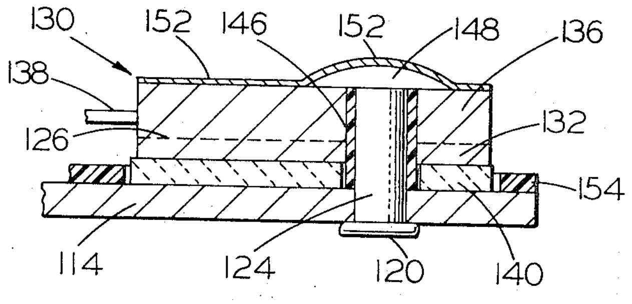
FIG. 6 is a vertical sectional view of a modified form of a mounted semiconductor device as seen in FIG. 5.

One such alternative mode is by means of the structure illustrated in FIGS. 6 and 7. In this mode the numbered elements bearing numbers similar to the numbered elements of FIGS. 1 through 5 have functions essentially the same as those described above in relation to FIGS. 1 through 5.

Insulating jacket 136, which forms the upper portion of the semiconductor device 130 as illustrated in FIG. 6, extends over the full length of the metal tab 132. This is in contrast to the form of insulating jacket illustrated in FIG. 5 and extending over only a portion of the metal tab. The insulating jacket portions of these devices are those above dashed line 26 of FIG. 5 and dashed line 126 of FIG. 6. The particular mode of construction of semiconductor devices does not form a part of this invention and their sectional illustrations are accordingly made in the form of blocks of material divided into an upper and lower portion by a dashed line rather than in structural detail.

No insulating spacer is employed in the alternative mode illustrated in FIG. 6. The insulating means for maintaining electrical isolation between tab 132 and metal shank 124 of the rivet is insulating collar 146.

What is claimed as new and desired to be secured by letters patent of the United States is:

1. An isolation mounting for a semiconductor device which comprises a heat sink plate having a mounting hole therein, a semiconductor device including a metal tab having a solid state element attached thereto and a mounting hole through said tab, a heat conductive electrically insulating wafer having a mounting hole therethrough, the holes of said plate, tab, and wafer being aligned, metal attachment means extending through the respective holes and maintaining said wafer between said tab and said plate in pressure contact with said plate and tab, insulating means for isolating the metal of said tab from the metal of said attachment means, said insulating means including an insulating spacer of a low compressibility material between the attachment means and the metal surface around the hole of said tab, and said insulating means including an insulating collar of a high compressibility material between the attachment means and the metal surface within the hole of said tab.

2. The isolation mounting of claim 1 in which the attachment means is a metal fastener.

3. The isolation mounting of claim 1 in which the attachment means is a rivet deformed at one end thereof against said plate.

4. The isolation mounting of claim 1 in which the insulating means includes a deformable insulating collar extending through the hole of said tab and of said wafer.

5. The isolation mounting of claim 1 in which the insulating means includes a collar of greater length than the length of the aligned holes of said plate, tab and wafer, and in which said collar is compressed against said spacer and against the rivet extending therethrough.

6. The isolation mounting of claim 1 in which the heat sink plate is the face plate of a dimmer device.

7. The isolation mounting of claim 1 in which the insulating wafer is a metal oxide in ceramic form of high heat conductivity.

8. The isolation mounting of claim 1 in which the solid state device is encased within an insulating jacket.

* * * * *